United States Patent [19]

Ebneth

[11] 4,201,825
[45] May 6, 1980

[54] METALLIZED TEXTILE MATERIAL

[75] Inventor: Harold Ebneth, Leverkusen, Fed. Rep. of Germany

[73] Assignee: Bayer Aktiengesellschaft, Leverkusen, Fed. Rep. of Germany

[21] Appl. No.: 946,430

[22] Filed: Sep. 27, 1978

[30] Foreign Application Priority Data

Sep. 29, 1977 [DE] Fed. Rep. of Germany ....... 2743768

[51] Int. Cl.$^2$ ..................... B32B 15/14; B32B 15/20
[52] U.S. Cl. ................................... 428/263; 427/123; 427/304; 427/305; 427/306; 428/289
[58] Field of Search ............. 427/123, 304, 305, 306; 428/245, 253, 254, 263, 289, 922, 260, 264, 265

[56] References Cited

U.S. PATENT DOCUMENTS

| | | | |
|---|---|---|---|
| 3,011,920 | 12/1961 | Shipley | 427/437 |
| 3,378,400 | 4/1968 | Sickles | 427/437 |
| 3,379,556 | 4/1968 | Chiecchi | 427/437 |
| 3,967,010 | 6/1976 | Maekawa | 427/306 |

*Primary Examiner*—James J. Bell
*Attorney, Agent, or Firm*—Sprung, Felfe, Horn, Lynch & Kramer

[57] ABSTRACT

The invention relates to a metallized textile material having a surface resistance as measured at 23° C./50% relative humidity in accordance with DIN 54 345 of at most $1 \times 10^3$ ohm. The invention also relates to a process for the production of such metallized textile material by currentless metal deposition, preferably at room temperature, thereon wherein the activation of the material is effected in a colloidal palladium solution, preferably at room temperature.

8 Claims, No Drawings

METALLIZED TEXTILE MATERIAL

This invention relates to a metal-coated textile material and to a process for its production.

In conventional processes for the production of metallised fibres with a firmly adhering metal layer, in particular by currentless metal deposition, the fibres or filaments are deoiled, etched or mechanically roughened before being subjected to currentless metal deposition. According to German Offenlegungsschrifts Nos. 2,250,309 and 1,804,042, the etching pretreatment, as known from plastics, is essential because without it the adhesion of the metal layer to the fibre is reduced, making it impossible to obtain metallised fibres of any practical use.

According to German Offenlegungsschrift No. 2,250,309, alkali metal hydroxides for example are used for etching whereas, according to French Pat. No. 1,567,529, chromosulphuric acid is used.

In addition, according to the prior art, the fibres are always sensitised with acidic, ionic sensitising baths, for example with acid tin(II)chloride, and activated with acidic, ionic activating baths, for example palladium-chloride, at elevated temperatures in the range of from 50° to 90° C. in order to guarantee subsequent metal deposition at elevated temperatures in acidic metallising baths, preferably at 75° C. and higher, using nickel or copper.

However, both the etching pretreatment and also the use of ionic metallising systems involve several disadvantages which hitherto have prevented metallised fibres from being used on a commercial scale.

It has now been found that filaments, fibres and textile structures can be provided with a firmly adhering metal coating without any need for a preliminary etching treatment, providing the metal is deposited from colloidal systems.

Accordingly, the invention relates to a metallised (metal-coated) textile material, for example filaments, fibres and textile structures, which is obtainable for example by activating the textile material at room temperature with colloidal palladium and treating the activated textile material at room temperature with alkaline metal reducing baths.

According to the invention, it is particularly preferred to treat a textile material of filaments or fibres of acrylonitrile polymers containing at least 40% by weight of acrylonitrile.

In principle, however, is is also possible in accordance with the invention to treat textile materials of filaments or fibres of filament-forming synthetic polymers of polyamide, polyester, polyalkylene, polymodacrylic or polyvinyl halides, and also cotton.

The acrylic fibres or filaments which may be metallised in accordance with the invention are any fibres which have been produced by a dry spinning or wet spinning process, preferably by the dry spinning of acrylonitrile polymers from strongly polar organic solvents, such as dimethyl formamide, dimethyl acetamide or dimethyl sulphoxide.

The acrylonitrile polymers used may be any of the polymers normally used for the production of synthetic acrylic fibres. The products in question are primarily substrates of the type which consist entirely of acrylonitrile or of at least 85% by weight of acrylonitrile and which, in addition, contain for example (meth)acrylates, vinyl carboxylates, (meth)allyl carboxylates, (iso)butenyl carboxylates, maleates, fumarates, (meth)acrylamides and N-substituted derivatives, vinyl ethers, styrene and derivatives, methacrylonitrile, and also dye-receptive additives such as for example, (methacrylic acid, itaconic acid, maleic acid, vinyl- or (meth)allyl-styrene sulphonic acid, sulphoalkyl(meth) acrylates, vinyl(meth)allyl phosphonic acid and N-sulphoalkyl (meth)acrylamide.

It is, of course, also possible to use acrylonitrile co-polymers containing far less than 85% by weight of acrylonitrile, i.e. so-called modacrylics, for example of acrylonitrile and/or vinyl or vinylidene halide in quantities of from 40 to 60% by weight.

Two-component fibres may also be treated.

Where reference is made in the following to fibres, it should be understood that filaments and textile structures, such as sheet-form structures, for example knitted and woven fabrics, and vleeces are also included. The actual metallisation process is preferably carried out as follows:

An activating solution of colloidal palladium is prepared with tin(II)salts in accordance with German Auslegeschrift No. 1,197,720. The pH-value of the solution should always be not greater than 1 and an excess of tin(II)ions should be present.

The material to be activated is then treated in this activating bath, preferably at room temperature, for residence times of from a few seconds to a few minutes, for example from 10 seconds to 2 minutes. However, the treatment may also be continued for several minutes without any adverse effects occurring.

The material thus activated is then removed from the activating bath and rinsed with water, preferably at room temperature.

It has proved to be particularly favourable to continue rinsing until the rinsing water shows a neutral reaction.

The rinsing operation is optionally carried out in several steps.

The material thus treated is then treated for about 30 seconds to about 2 minutes in an acid or alkaline medium. Where the treatment is carried out in an acid medium, treatment in a 5% by weight sulphuric acid or approximately 20% by weight hydrochloric acid has proved to be adequate. However, the material is preferably treated in an alkaline medium. In this case, an approximately 5% sodium hydroxide solution or an approximately 10% by weight sodium carbonate solution, preferably at room temperature, has produced the best results.

The material is then briefly rinsed in water, preferably at room temperature, for example for up to 30 seconds, in order to remove excess treatment medium.

After this rinse, the material is introduced at about 16° to about 30° C. into an alkaline metal salt bath in which the metal is deposited on the material.

Metal salt baths such as these are, preferably, baths of nickel salts, cobalt salts or mixtures thereof, copper salts, gold salts or other salts which can be deposited from alkaline baths.

According to the invention it is particularly preferred to use ammoniacal nickel baths or copper baths alkalised with sodium hyroxide. It is, of course, also possile to use mixtures of ammonia and sodium hydroxide for maintaining the alkaline medium.

Metallising baths such as these are known in the currentless metallisation art.

Baths of the following composition have proved to be particularly advantageous: a nickel bath of 0.2 mole/l of nickel(II)chloride, 0.9 mole/l of ammonium hydroxide (25% by weight solution), 0.2 mole/l of sodium hydrophosphite and free ammonia in such a quantity that the pH-value at 30° C. amounts to 8.9, or a copper bath of 30 g/l of copper(II)sulphate, 100 g/l of Seignette salt and 50 ml/l of a 37% by weight formaldehyde solution. This copper bath is adjusted with sodium hydroxide to a pH-value of 11 to 12. In place of the hydrophosphite or formaldehyde also dialkylamine borane or $NaBH_4$ as reducing agent may be used.

The residence time of the material to be metallised in the described metallising bath is determined by the required thickness of the metal layer on the surface of the material. The residence time is preferably between 1 and 5 minutes. For a residence time of about 5 minutes, the metal can be deposited in layer thicknesses of about 0.2 μm.

Surprisingly, it is possible with the metallisation according to the invention, i.e. by using colloidal palladium activating solutions at room temperature and alkaline metallising baths at room temperature, to obtain on the metallised fibre surface resistances lower by powers of ten than those obtainable where ionic activating baths and acidic metallising baths are used, without any need for the fibres to be degreased, etched, roughened or otherwise pretreated beforehand.

According to the invention, therefore, it is possible to obtain metallised textiles of which the surface resistance, as measured in accordance with DIN No. 54345, amounts to at most $1 \times 10^3$ ohm at 23° C./50% relative humidity, whereas metallised textiles metallised from ionic activating baths and acidic metallising baths have surface resistances of approximately $10^6$ and higher.

The textile material metallised in accordance with the invention is, for example, an excellent material for surface heating elements, for wall heating systems, and for safety heating systems in the textile sector, for example heatable flippers, heatable clothing and the like.

It is also eminently suitable for the production of antistatically finished clothing, carpets and filter cloths.

It is also possible to use a combination of copper plated and nickel plated wall coverings for electromagnetically screening off rooms from monitoring equipment. Electrical equipment can also be readily screened off from foreign waves and interfering frequencies.

The following Examples illustrate the invention without limiting it.

EXAMPLE 1

A knitted fabric of a fibre yarn of an acrylonitrile polymer (94% by weight of acrylonitrile, 5.5% by weight of methyl acrylate and 0.5% by weight of sodium methallyl sulphonate) is immersed at room temperature in a hydrochloric acid bath (pH≦1) of a colloidal palladium solution containing excess Sn(II)ions as described in German Auslegeschrift No. 1,197,720. After a residence time of from 30 seconds to 2 minutes, during which it is gently moved, the fabric is removed from the bath and thoroughly rinsed with water. It is then introduced into an approximately 5% sodium hydroxide solution at room temperature. The fabric is treated for between about 30 seconds and 2 minutes, again with gentle movement, subsequently removed and then rinsed with water. The fabric is then introduced into a solution of 0.2 mole/l of nickel (II) chloride, 0.9 mole/l of ammonium hydroxide and 0.2 mole/l of sodium hypophsphite, into which ammonia has been introduced in such a quantity that the pH-value at 30° C. amounts to 8.9. After about 15 seconds, the surface of the sheet-form textile fabric begins to turn dark in colour. After only 30 seconds, the fabric is covered with a thin layer of nickel and is dark in colour. After about 5 minutes, the nickel layer has a thickness of 0.2 μm. The fabric is then removed from the bath and washed thoroughly with water at room temperature until the washing water shows a neutral reaction.

The surface resistance, as measured at 23° C./50% relative humidity in accordance with DIN No. 54345, amounted to $1 \times 10^1$.

The volume resistance, as measured at 23° C./50% relative humidity in accordance with DIN No. 54345, amounted to $3 \times 10^2$ ohm.cm$^2$.

EXAMPLE 2

The procedure was as in Example 1, except that the fabric used had been knitted from a filament yarn of an acrylonitrile polymer (100% acrylonitrile).

After a residence time of 2 minutes in the nickel bath, the layer thickness of the nickel deposit amounted to 0.15 μm.

This material had a surface resistance of $4 \times 10^1$ ohm. Its volume resistance amounted to $6 \times 10^2$ ohm cm$^2$.

EXAMPLE 3

The procedure was as in Example 1 except that a fabric knitted from a fibre yarn of an acrylonitrile copolymer consisting of 40% by weight of acrylonitrile units and 60% by weight of vinyl chloride units was used.

After about 5 minutes, the thickness of the nickel layer amounted to approximately 0.2 μm.

The surface resistance amounted to $2 \times 10^1$ ohms.

The volume resistance amounted to $6 \times 10^2$ ohm cm$^2$.

EXAMPLE 4

Cotton was briefly washed with a standard commercial-grade detergent and, after rinsing, was immersed in a hydrochloric acid bath of a colloidal palladium solution at pH≦1 and at room temperature in accordance with Example 1.

After a residence time of from 2 to 3 minutes, during which it was gently moved, the cotton fibre was removed from the bath, rinsed with water and subsequently introducing into a 5% sodium hydroxide solution at room temperature. After about 2 minutes, it was removed from the bath, rinsed with water and introduced into a nickel salt solution (as described in Example 1) at room temperature. After about 10 to 12 seconds, the surface of the cotton began to turn dark in colour. After about 30 seconds, the fibre was almost completely covered with a thin, almost black layer of nickel. After about 2.5 minutes, the nickel-coated cotton was removed from the nickel bath and thoroughly rinsed.

The surface resistance amounted to $5 \times 10^1$ ohms for a nickel layer thickness of approximately 0.12 μm (as measured on a sample which had been removed from the metallising bath after only 2 minutes) and to $4 \times 10^1$ ohm for a nickel layer thickness of approximately 0.15 μm (as measured after a treatment time of 2.5 minutes).

EXAMPLE 5

A woven fabric of a polyacrylonitrile multifilament yarn (100% polyacrylonitrile) as immersed in a colloidal palladium solution of the type described in Example 1. After a residence time of 2 minutes at room temperature, during which it is gently moved, the fabric is removed from the bath, thoroughly washed in pure water and then immersed for 2 minutes at room temperature in a 5% by weight sodium hydroxide solution. After rinsing with pure water, the fabric thus pretreated is introduced into an alkaline copper bath of 30 g/l of copper sulphate, 100 g/l of Seignette salt and 50 ml/l of a 37% by weight formaldehyde solution which had been adjusted with sodium hydroxide solution to a pH-value of from 11 to 12. After about 20 seconds, the surface of the yarn begins to turn dark in colour. After only about 40 seconds, it shows a metallic coppery lustre. After about 5 minutes, the fabric is removed from the metallising bath, thoroughly rinsed and dried in air. The layer thickness of the copper amounted to 0.2 $\mu$m.

The surface resistance amounted to $0.6 \times 10^1$ ohm.

EXAMPLE 6

A fabric knitted from a fibre yarn of an acrylonitrile polymer (94% by weight of acrylonitrile units, 5.5% by weight of units of methyl acrylate and 0.5% by weight of sodium methallyl sulphonate units) was immersed at room temperature in a hydrochloride acid bath of a colloidal palladium solution at a pH-value of 1. After a residence time in this bath of about 2 minutes, during which it was gently moved, the knitted fabric was removed and thoroughly rinsed with water. It was then introduced into a 5% by weight sodium hydroxide solution at room temperature in which it remained with gently movement for about 2 minutes. It was then removed, rinsed with water and introduced into the alkaline copper sulphate solution described in Example 5 at room temperature. After about 5 minutes, the fabric was removed from the bath, washed thoroughly with water at room temperature until it showed a neutral reaction and then dried in air. The thickness of the copper coating amounted to approximately 0.2 $\mu$m.

The surface resistance amounted to $0.4 \times 10^1$ ohm.
The volume resistance amounted to $6 \times 10^1$ ohm. cm$^2$.

EXAMPLE 7 (Comparison)

A knitted fabric of a fibre yarn of an acrylonitrile polymer (94% by weight of acrylonitrile units, 5.5% by weight of units of methyl acrylate and 0.5% by weight of sodium methallyl sulphonate units) was immersed at 55° C. in a hydrochloric acid palladium (II) chloride bath at pH 2. After a residence time of about 5 minutes in this bath, during which it was gently moved, the fabric was removed and rinsed thoroughly with water until a neutral reaction was obtained. The knitted fabric was then introduced into an alkaline sodium hypophosphite bath at pH 9.8 in which it remained for 2 minutes at about 30° C. After rinsing with water until a neutral reaction had been obtained, the knitted fabric was introduced into a nickel (II) chloride solution of pH 4.8 at a temperature of 55° C.

After about 50 seconds, nickel metal began to be deposited on the surface.

Samples of the nickel-coated knitted fabric were removed from the acid nickel bath after 1 minute, 1.5 minutes, 2 minutes, 3 minutes and 5 minutes, washed with water until a neutral reaction was obtained and dried.

The surface resistances, as measured at 23° C./50% relative humidity in accordance with DIN No. 54345 were found to be as shown in Table 1 below.

TABLE 1

| minutes | surface resistance (ohm) | ditto after blank dyeing |
|---|---|---|
| 1 | $7 \times 10^{12}$ | |
| 1½ | $5 \times 10^{12}$ | |
| 2 | $1 \times 10^{11}$ | |
| 3 | $1 \times 10^6$ | |
| 5 | $6 \times 10^5$ | $1 \times 10^7$ |

A sheet-form textile fabric of the type described in Example 1 was coated with nickel in accordance with the invention (as in Example 1) and the surface resistance values were measured after 1, 2, 3 and 5 minutes. The results obtained are set out in Table 2 below.

TABLE 2

| minutes | surface resistance (ohms) | ditto after blank dyeing |
|---|---|---|
| 1 | $6 \times 10^1$ | |
| 2 | $4 \times 10^1$ | |
| 3 | $3 \times 10^1$ | $7 \times 10^1$ |
| 5 | $4 \times 10^1$ | $2 \times 10^2$ |

The blank dyeing referred to in Tables 1 and 2 was carried out as follows:

The metallised sample was introduced into a vessel filled with acetic acid at pH-value of 4.8. The acetic acid was then heated to boiling temperature and left for 1 hour at that temperature. After cooling the sample was removed, washed once with water and dried. After drying and conditioning at 23° C./50% relative air humidity in accordance with DIN No. 54345, the surface resistance was measured in ohms.

EXAMPLE 8

Samples of the nickel-coated knitted fabric of Example 1 were washed for about 30 minutes at 30° C. in a washing machine filled with water containing 5 g per liter of emulsifier. After each wash, the sample was dried, conditioned at 23° C./50% relative humidity and its surface resistance was measured in accordance with DIN No. 54345.

The measured surface resistance values are shown in Table 3 below.

TABLE 3

| before washing | after the $x^{th}$ wash | | | | |
|---|---|---|---|---|---|
| | X = 1 | X = 3 | X = 5 | X = 10 | |
| $10^1$ | $3 \times 10^1$ | $6 \times 10^1$ | $2 \times 10^2$ | $3 \times 10^2$ ohm | |

It was found that, even after ten washes of 30 minutes each, there was no significant increase in the electrical surface resistance of the material metallised in accordance with the invention.

What we claim is:

1. A metallised (metal coated) textile material having a surface resistance, as measured at 23° C./50% relative humidity in accordance with DIN No. 54345, of at most $1 \times 10^3$ ohm.

2. The metallised textile material of claim 1, wherein the metal is present on the textile material in a coating at most 0.3 $\mu$m thick.

3. The metallised textile material of claim 1, wherein said metal coating consists of nickel.

4. The metallised textile material of claim 1, wherein said metal coating consists of copper.

5. A process for the production of a metallised textile material having a surface resistance, as measured at 23° C./50% relative humidity in accordance with DIN No. 54345, of at most $1 \times 10^3$ ohms, which comprises introducing a textile material to be metallised into an acidic colloidal palladium solution containing tin(II)ions in excess, treating the material thus activated with an acid or alkali, and then coating the material in a metallising bath with metal by currentless deposition from an alkaline metal salt solution.

6. The process of claim 5, wherein said metallising bath is operated at room temperature.

7. The process of claim 5, wherein said metallising bath is an ammoniacal nickel or copper bath.

8. The process of claim 5, wherein said metallising bath is a copper bath alkalised with sodium hydroxide.